(12) United States Patent
Voigt et al.

(10) Patent No.: US 7,163,857 B2
(45) Date of Patent: Jan. 16, 2007

(54) BURIED STRAP CONTACT FOR A STORAGE CAPACITOR AND METHOD FOR FABRICATING IT

(75) Inventors: Peter Voigt, Hallbergmoos (DE); Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 82 days.

(21) Appl. No.: 10/875,787

(22) Filed: Jun. 25, 2004

(65) Prior Publication Data

US 2005/0026359 A1    Feb. 3, 2005

(30) Foreign Application Priority Data

Jun. 26, 2003    (DE) ................. 103 28 634

(51) Int. Cl.
*H01L 21/8242* (2006.01)
(52) U.S. Cl. .................. 438/243; 438/248; 438/386; 438/391
(58) Field of Classification Search ........... 257/301, 257/304; 438/243, 246, 248, 386, 389, 391
See application file for complete search history.

(56) References Cited

U.S. PATENT DOCUMENTS

| 5,283,453 | A  | * | 2/1994 | Rajeevakumar | 257/304 |
| 5,521,114 | A  | * | 5/1996 | Rajeevakumar | 438/386 |
| 6,404,000 | B1 | * | 6/2002 | Divakaruni et al. | 257/296 |
| 6,500,707 | B1 |   | 12/2002 | Schrems | |
| 6,838,335 | B1 | * | 1/2005 | Bonart et al. | 438/247 |
| 2004/0021163 | A1 | * | 2/2004 | Bonart et al. | 257/301 |
| 2004/0256665 | A1 | * | 12/2004 | Birner et al. | 257/329 |

FOREIGN PATENT DOCUMENTS

| DE | 101 36 333 A1 | 3/2003 |
| DE | 101 52 549 A1 | 5/2003 |
| DE | 102 33 916 C1 | 8/2003 |

* cited by examiner

*Primary Examiner*—Mary Wilczewski
*Assistant Examiner*—Toniae M. Thomas
(74) *Attorney, Agent, or Firm*—Morrison & Foerster LLP

(57) ABSTRACT

A buried strap contact between a trench capacitor of a memory cell and the subsequently formed selection transistor of the memory cell is fabricated such that the inner capacitor electrode layer is etched back in the trench of the trench capacitor and the uncovered insulator layer is then removed at the trench wall in order to define the region of the buried strap contact area. A liner layer is subsequently deposited in order to cover the inner capacitor electrode layer in the trench and the uncovered trench wall and thus to form a barrier layer. A spacer layer with the material of the inner electrode layer is then formed on the liner layer at the trench wall. Finally, the uncovered liner layer is removed above the inner electrode layer and the trench is filled with the material of the inner electrode layer in order to fabricate the buried strap contact.

8 Claims, 6 Drawing Sheets

BURIED STRAP CONTACT FOR A STORAGE CAPACITOR AND METHOD FOR FABRICATING IT

CLAIM FOR PRIORITY

This application claims the benefit of priority to German Application No. 103 28 634.9, filed in the German language on Jun. 26, 2003, the contents of which are hereby incorporated by reference.

TECHNICAL FIELD OF THE INVENTION

The invention relates to a method for fabricating a buried strap contact between a trench capacitor and a selection transistor of a memory cell and to a memory cell having such a construction.

BACKGROUND OF THE INVENTION

In integrated circuits, in particular dynamic random access memories (DRAM memories), capacitors are generally used for storing charge. A DRAM memory cell is composed of a selection transistor and a storage capacitor, the information items being stored in the storage capacitor in the form of electrical charges. In this case, a DRAM memory has a matrix of such DRAM memory cells which are connected up in the form of rows and columns. The row connections are usually referred to as word lines, and the column connections as bit lines. The selection transistor and the storage capacitor in the individual DRAM memory cells are in this case connected to one another such that, in the event of the selection transistor being driven via a word line, the charge of the storage capacitor can be read in and out via a bit line.

A main focus in the technological development of DRAM memory cells is the storage capacitor. A storage capacitance of 20 to 50 fF is necessary in order to obtain a sufficient read signal. In order to achieve such a storage capacitance in the context of a continually decreasing cell area of the DRAM memory cell, use is made of so-called trench capacitors which utilize the third dimension. Trench capacitors are usually fabricated such that deep trenches are etched into the semiconductor substrate and are then filled with a dielectric layer and a first capacitor electrode, the so-called storage electrode. In this case, the storage electrode is generally an $n^+$-doped polysilicon filling. Furthermore, a second capacitor electrode, also referred to as a buried plate, is formed in the semiconductor substrate e.g. by outdiffusion of n-type doping atoms of a dopant source around the lower section of the trench.

The selection transistor of the DRAM memory cell is then usually produced as a planar field-effect transistor beside the trench capacitor. The selection transistor has two highly doped diffusion regions, which form the source-drain electrodes and are separated by a channel region, one diffusion region being connected to the bit line of the DRAM memory cell. By contrast, the other diffusion region is connected to the storage electrode via a capacitor connection region, the so-called buried strap. The channel of the selection transistor is furthermore isolated by means of a gate dielectric layer from a gate electrode layer connected to the word line of the DRAM memory cell.

A read-in and read-out operation of the DRAM memory cell is controlled by the word line such that, as a result of the application of a voltage to the gate electrode layer, a current-conducting channel is produced between the source/drain electrodes of the selection transistor, so that information in the form of charge can be read into and out of the storage electrode via the buried strap contact.

The buried strap contact between the storage electrode and the source/drain electrode is generally fabricated such that the $n^+$-type polysilicon filling, which is surrounded by an insulator layer, generally an $SiO_2$ layer, in the upper trench region, is etched back into the trench. Afterward, the uncovered insulator layer is then removed from the trench wall and an $n^+$-type polysilicon deposition of the trench is then performed again in order to fabricate a contact area between the $n^+$-type polysilicon filling of the storage electrode and the adjoining semiconductor substrate, in which the diffusion regions of the selection transistor are subsequently embodied. After the removal of the uncovered insulator layer at the trench wall and before the filling with the $n^+$-type polysilicon in order to form the buried strap contact, a thin liner layer, preferably $Si_3N_4$, is applied. Said liner layer serves as a barrier layer in order to prevent the $n^+$-type polysilicon from coming into contact with the monocrystalline substrate during the filling of the buried strap contact, which would lead to undesirable recrystallization of and thus damage to the semiconductor substrate, which would then provide for a high resistance in this region that is utilized as a diffusion zone for the selection transistor. In this case, however, the liner layer in turn is thin enough to enable tunneling of charge carriers and thus an exchange of charge between the storage electrode and the source/drain electrode of the selection transistor via the buried strap contact.

The contact resistance between the storage electrode of the trench capacitor and the adjoining diffusion zone of the selection transistor constitutes an ever greater problem, however, on account of the increasing structural miniaturization. Since the previous process control means that, during the formation of the buried strap contact, the liner layer is also inevitably formed between the buried strap contact and the storage electrode, the contact resistance is very high on account of the intervening liner layer, particularly at low temperatures of $-10°$ C. or less. In previous generations of DRAM memory cells, this contact resistance was still acceptable owing to the low speed requirements and the large cross section of the buried strap contact in the region of the trench capacitor. In the context of the further increasing constriction of the upper region of the trench capacitor and thus of the cross section of the buried strap contact, there is the risk, however, that enough charge will no longer be able to flow into the trench capacitor, which may lead to a failure of the DRAM memory cell.

SUMMARY OF THE INVENTION

The invention provides an improved structure of a buried strap contact for a trench capacitor of a DRAM memory cell and a method for fabricating it, which are distinguished by a reduced contact resistance between the buried strap contact and the storage electrode.

According to one embodiment of the invention, the buried strap contact between a trench capacitor of a memory cell and the subsequently formed selection transistor of the memory cell is fabricated in such a way that the inner capacitor electrode layer is etched back in the trench of the trench capacitor and then the uncovered insulator layer is removed at the trench wall in order to define the region of the buried strap contact therein. Afterward, a liner layer is deposited in order to cover the inner capacitor electrode layer in the trench and the uncovered trench wall and thus to form a barrier layer. A spacer layer with the material of the inner capacitor electrode layer is then formed on the liner layer at the trench wall and the uncovered liner layer is removed above the inner electrode layer in the trench. Finally, the trench is filled with the material of the inner capacitor electrode layer in order to fabricate the buried strap contact.

Removing the liner layer between the buried strap contact and the inner capacitor electrode layer reduces the resistance between the buried strap material and the storage electrode and thus affords the possibility of conducting sufficient charge from the selection transistor via the buried strap contact into the storage electrode of the trench capacitor and thus of avoiding a failure of the DRAM memory cell.

In accordance with a preferred embodiment, the semiconductor substrate is a silicon substrate, the material of the inner capacitor electrode layer is polysilicon and the liner layer is an $Si_3N_4$ layer. This material design ensures a particularly low contact resistance via the buried strap contact. It is preferred in this case to form the liner layer with a layer thickness of approximately 1 nm, so that the $Si_3N_4$ layer remaining at the interface between the silicon substrate and the buried strap contact provides for a reliable blocking effect and at the same time for adequate tunneling and thus a sufficient charge carrier flow.

It is furthermore preferred to form the spacer layer for the removal of the liner layer on the inner capacitor electrode layer in the trench in a self-aligning manner such that a layer with the material of the inner capacitor electrode layer is deposited in large-area fashion and the layer is essentially removed again from the horizontal area by anisotropic etching, so that the trench bottom is uncovered. This procedure subsequently enables the liner layer to be removed simply and cost-effectively from the trench bottom. In this case, the liner layer is preferably to be concomitantly removed straight away during the anisotropic etching-back of the spacer layer, in order to save a further process step and thus to enable a particularly cost-effective fabrication.

BRIEF DESCRIPTION OF THE DRAWINGS

The invention is explained in more detail with reference to the accompanying drawings, in which.

DETAILED DESCRIPTION OF THE INVENTION

The invention is explained on the basis of the fabrication of trench capacitors in the context of a process sequence for forming silicon-based DRAM memory cells. However, the trench capacitors with buried strap contents according to the invention can also be used in other large scale integrated circuits requiring storage capacitance. The trench capacitors are preferably formed using planar technology, comprising a sequence of individual processes that each act over the whole area of the wafer surface, a local alteration of the silicon substrate being carried out in a targeted manner by means of a suitable masking step. In this case, a multiplicity of memory cells with corresponding trench capacitors are formed simultaneously during the DRAM fabrication. In the text below, however, the invention is illustrated only with regard to the formation of an individual trench capacitor.

Figure 1:
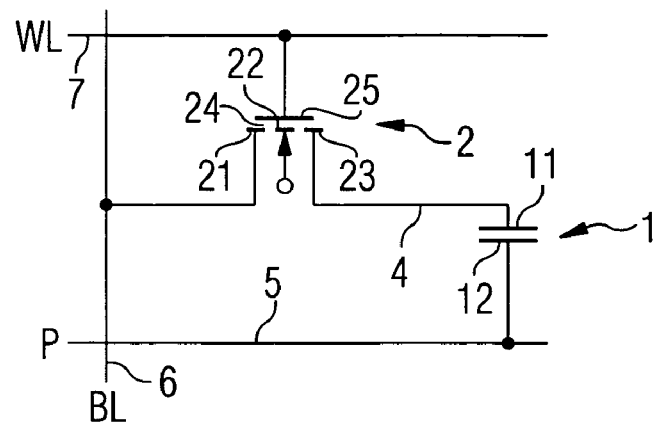
FIG. 1 shows a circuit diagram of a DRAM memory cell.

DRAM memories predominantly use the one-transistor cell concept, the circuit diagram of which is shown in FIG. 1. These memory cells comprise a storage capacitor 1 and a selection transistor 2. The selection transistor 2 is preferably constructed as a field-effect transistor and has a first source/drain electrode 21 and a second source/drain electrode 23, between which is arranged an active region 22, it being possible to form a current-conducting channel between the first electrode 21 and the second electrode 23 in the active region. Arranged above the active region 22 are an insulator layer 24 and a gate electrode 25, which act like a plate capacitor which can be used to influence the charge density in the active region 22.

The second electrode 23 of the selection transistor 2 is connected via an electrical connection 4 to a first electrode 11 of the storage capacitor 1. A second electrode 12 of the storage capacitor 1 is in turn connected to a conductive connection 5, which is preferably common to the storage capacitors of the DRAM memory. The first electrode 21 of the selection transistor 2 is furthermore connected to a bit line 6 in order that the information stored in the storage capacitor 1 in the form of charges can be read in or out. In this case, the read-in or read-out operation is controlled via a word line 7 connected to the gate electrode 25 of the selection transistor 2, in order, by application of a voltage, to produce a current-conducting channel in the active region 22 between the first source/drain electrode 21 and the second source/drain electrode 23.

As a result of using trench capacitors in DRAM memory cells, the three-dimensional structure enables the DRAM cell area to be significantly reduced and at the same time ensures a simple fabrication in the context of silicon planar technology. Such trench capacitors make it possible to achieve in particular a capacitor capacitance of approximately 20 to 50 fF, which is required in order to obtain a sufficient read/write signal for the DRAM cell.

Conventional trench capacitors have a trench which is etched into the silicon substrate and is typically embodied with a highly doped polysilicon. This polysilicon filling is insulated in the lower trench region by a storage dielectric layer, e.g. a nitride layer, from the outer capacitor electrode, which is formed by introducing doping atoms into the lower trench region. In the upper trench region, the polysilicon filling is isolated from the silicon substrate by an insulator layer in order to prevent a parasitic transistor from arising along the trench.

The selection transistor, which is generally embodied in planar fashion at the silicon substrate surface, has two diffusion regions which form the two source/drain electrodes, one diffusion region adjoining the trench. A capacitor connection, a so-called buried strap contact, is embodied in this region and connects the diffusion region of the selection transistor to the polysilicon filling in the trench. The buried strap contact likewise generally comprises highly doped polysilicon.

A problem exists here in that, during the formation in the context of silicon planar technology, before the introduction into the trench, the buried strap contact is isolated by a liner layer, preferably a thin $Si_3N_4$ layer, from the silicon substrate and the polysilicon filling in the trench in order to prevent the silicon substrate from being damaged during the introduction of the highly doped polysilicon material for forming the buried strap contact. However, the $Si_3N_4$ layer provides for an increased contact resistance in particular between the buried strap contact and the storage electrode of the trench capacitor, which may have the consequence that not enough charge is written to the storage electrode and the memory cell thus fails.

In order to prevent this, the invention effects removal of the process-dictated thin $Si_3N_4$ layer between the polysilicon filling that forms the buried strap and the polysilicon filling that forms the storage electrode.

Figure 2:
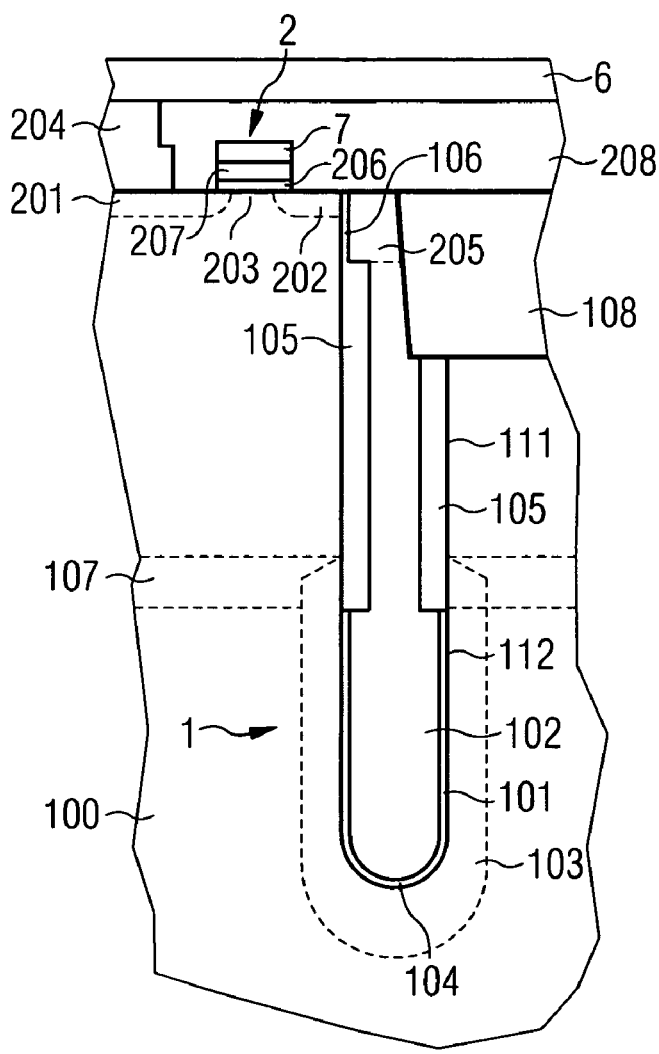
FIG. 2 shows a diagrammatic cross section through a DRAM memory cell with a buried strap contact according to the invention.

FIG. 2 shows a possible embodiment of a DRAM memory cell with a buried strap contact according to the invention between the selector transistor and the trench capacitor. In this case, the trench capacitor 1 is formed in the monocrystalline silicon substrate 100, which is weakly p-doped, e.g. with boron. A trench 101 is embodied in the silicon substrate 100. In a lower trench region 112, a heavily $n^+$-doped layer 103 is formed around the trench, said layer being doped with arsenic, for example. The $n^+$-doped layer 103, as a buried plate, forms the outer capacitor electrode of the trench capacitor.

The trench 101 embodied in the silicon substrate 100 is filled with an $n^+$-doped polysilicon layer 102, it being possible for the polysilicon to be doped e.g. with arsenic or phosphorus. This trench filling 102 forms the storage electrode of the trench capacitor 1. Between the $n^+$-doped outer layer 103 and the $n^+$-doped trench filling 102, a dielectric layer 104 is formed on the trench wall in the lower trench section 112 in order to isolate the two capacitor electrodes from one another. In this case, the storage dielectric 104 may comprise a stack of dielectric layers, e.g. oxide, nitrided oxide or oxide-nitride-oxide, or a different material having a high dielectric constant.

The selection transistor 2 of the DRAM memory cell has two diffusion regions 201, 202, which are produced by implantation of n-type doping atoms into the silicon substrate 100 and are separated by a channel 203. The first diffusion region 201 serves as a first source/drain electrode 21 of the selection transistor 2 and is connected to the bit line 6 by a contact plug 204. The channel 203 is furthermore isolated by a dielectric layer 206 from a gate electrode layer 207, which is part of the word line 7.

In the upper section of the trench 101, an insulator layer 105 comprising $SiO_2$ is provided between the trench wall and the filling layer 102 of the trench capacitor in a manner adjoining the dielectric layer 104. This $SiO_2$ layer 105 prevents a parasitic transistor from forming along the trench, which parasitic transistor would bring about an undesired leakage current. The buried strap contact 205 is arranged on the polysilicon trench filling 102, said buried strap contact being formed by an $n^+$-doped polysilicon filling in the trench above the insulator layer 105. The buried strap contact 205 produces the connection between the second diffusion region 202 of the selection transistor 2 and the filling layer 102 of the storage electrode 12 of the trench capacitor 1. A thin $Si_3N_4$ liner layer 106, preferably having a thickness of 1 nm, is formed between the buried strap contact 205 and the second diffusion region 202 of the selection transistor, which liner layer protects the silicon substrate 100 from damage during the filling of the buried strap contact with $n^+$-doped polysilicon. However, no such liner layer is provided between the buried strap contact 205 and the trench filling 102; such a liner layer would lead to an increased resistance between the buried strap and the trench filling.

This configuration on the one hand ensures that the thin $Si_3N_4$ layer 106 at the buried strap contact area protects the adjoining silicon substrate 100 from damage, at the same time an $Si_3N_4$ layer having been prevented from being formed between the buried strap contact 205 and the storage electrode 102; an $Si_3N_4$ between the buried strap contact and the storage electrode leads to a high resistance and thus an obstruction of the flow of charge into the trench capacitor.

An n-doped well 107 is furthermore provided in the silicon substrate 100, and serves as a connection of the buried plate 103 to the buried plates of the further memory cells. An insulator trench 106 (STI isolation) is formed in order to insulate the DRAM memory cells from one another. The gate electrode layer 207 and the word line 7 are insulated from the bit line 6 and the contact layer 204 to the first diffusion region 201 of the selection transistor by an oxide layer 208.

An operation of reading into and out of the DRAM cell is controlled by the word line 7 connected to the gate electrode layer 207 of the selection transistor 2. Application of a voltage produces a current-conducting channel between the diffusion zones 201, 202, so that information in the form of charge can be read into and out of the filling layer 102 of the trench capacitor via the buried strap contact 205. In this case, the charge tunnels through the thin $Si_3N_4$ layer 106 between the second diffusion region 202 of the selection transistor and the buried strap contact 205.

FIG. 3A to 3E show a possible method for producing a buried strap contact according to the invention for electrical connection between the trench capacitor 1 and the selection transistor 2 in the context of the standard DRAM process sequence.

Figure 3A:
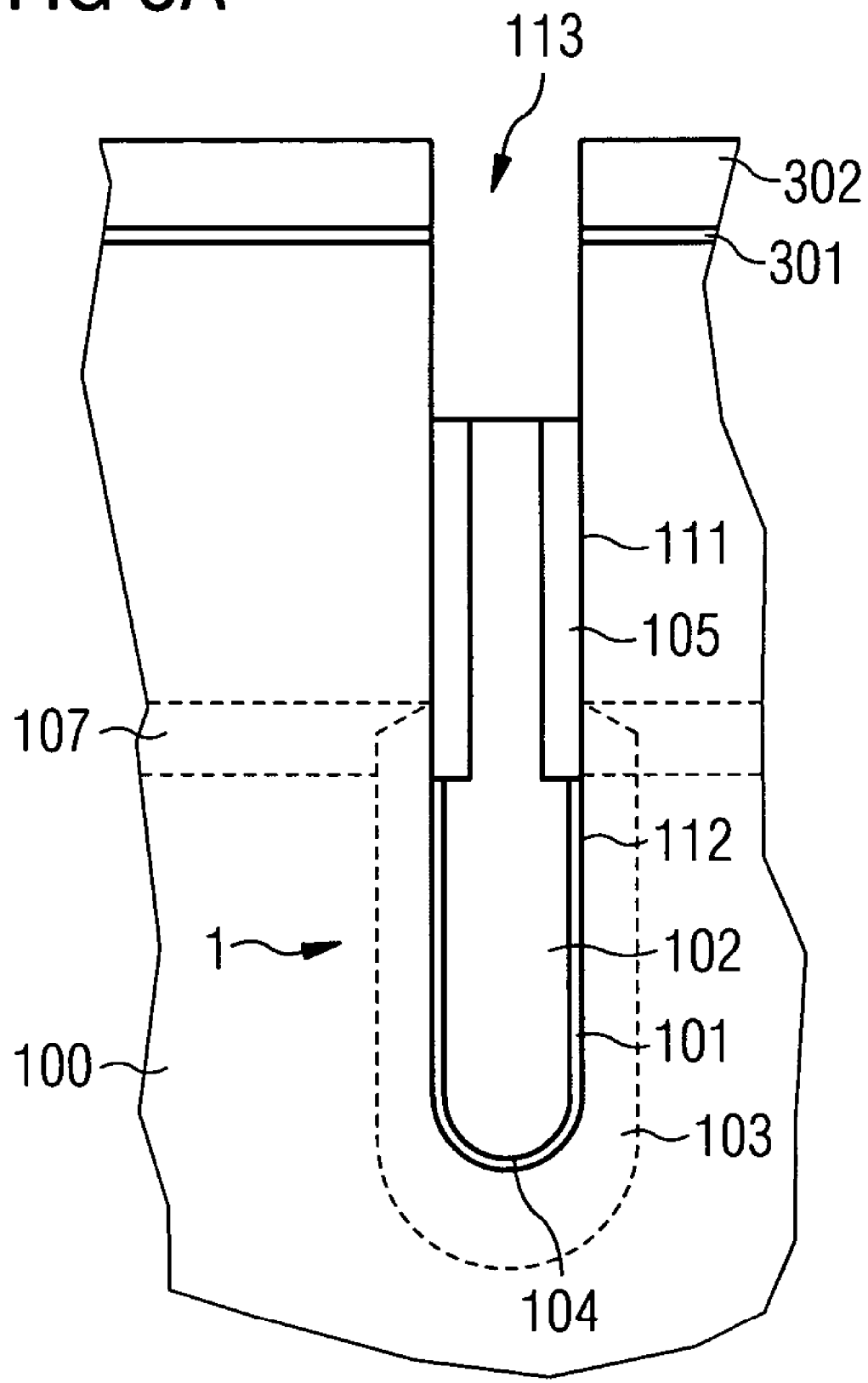
FIGS. 3A to 3E show a method according to the invention for fabricating a buried strap contact according to the invention in the standard DRAM process sequence.

The starting point is a process stage at which the trench capacitor 1 has already been formed. A diagrammatic cross section of this process stage is shown in FIG. 3A. The trench 101 embodied in the silicon substrate 100 is filled with the $n^+$-doped polysilicon layer 102. In the lower trench region 112, the dielectric layer 104 is formed at the trench wall, which isolates the outer capacitor electrode 103, embodied in $n^+$-doping, from the storage electrode 102. The outer capacitor electrode 103 is furthermore connected to the n-doped well 107. The $SiO_2$ oxide collar 105 is embodied in the upper trench region 111 in a manner adjoining the dielectric layer 104.

Figure 3B:
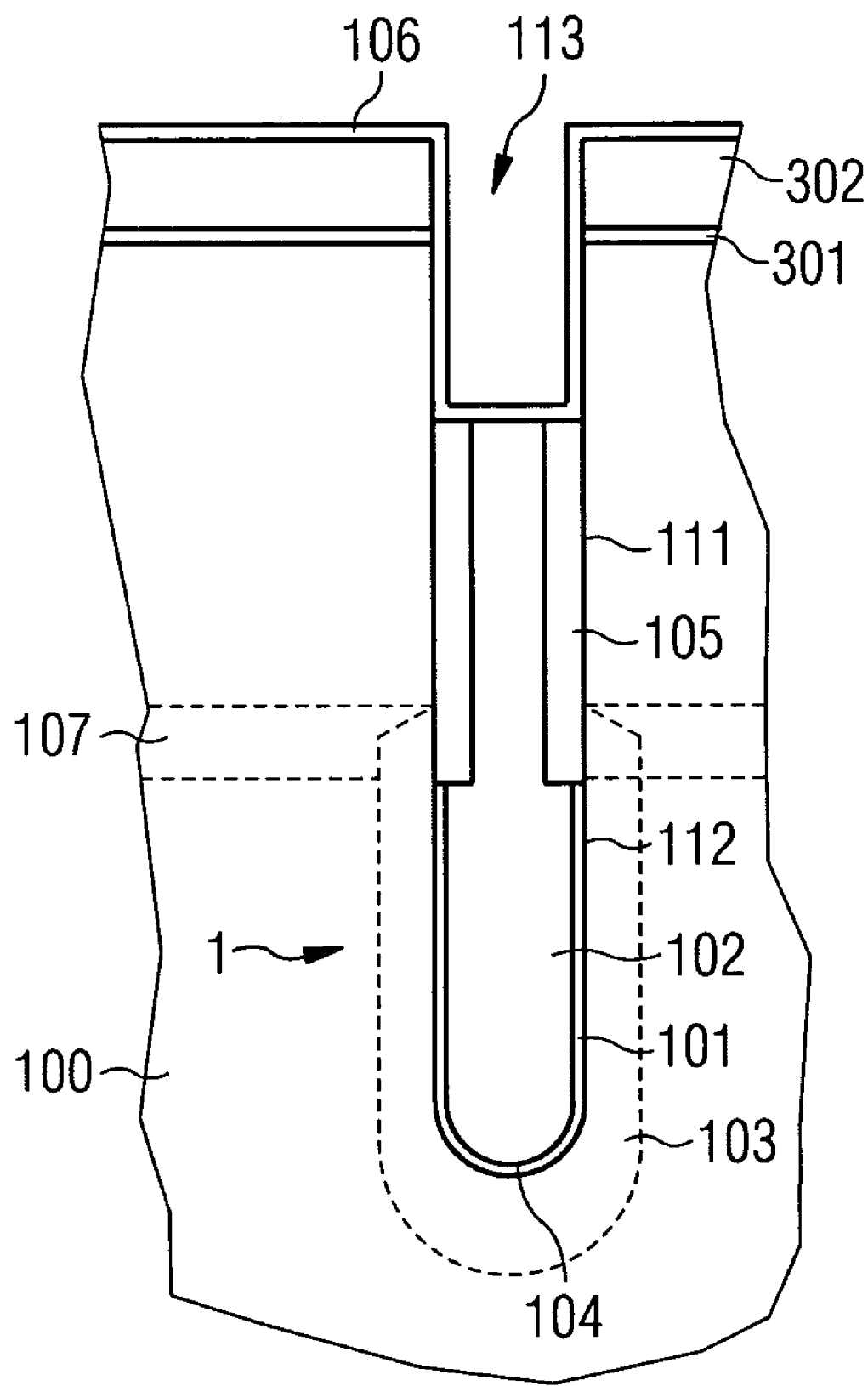

With the aid of a masking layer on the silicon substrate 100, which masking layer is composed of a thin $SiO_2$ layer 301 and a thicker $Si_3N_4$ layer 302 arranged thereon, an upper section 113 of the trench 101 is etched free in order to define the region of the buried strap contact. In order to form the buried strap contact, as is shown in FIG. 3B, in a first step, the thin $Si_3N_4$ liner layer 106 is then applied in large-area fashion. The layer thickness of the $Si_3N_4$ layer is preferably approximately 1 nm in this case. The liner layer 106 reliably ensures that the interface between the trench 101 and the silicon substrate 100 is protected from damage by the subsequent process steps.

Figure 3C:
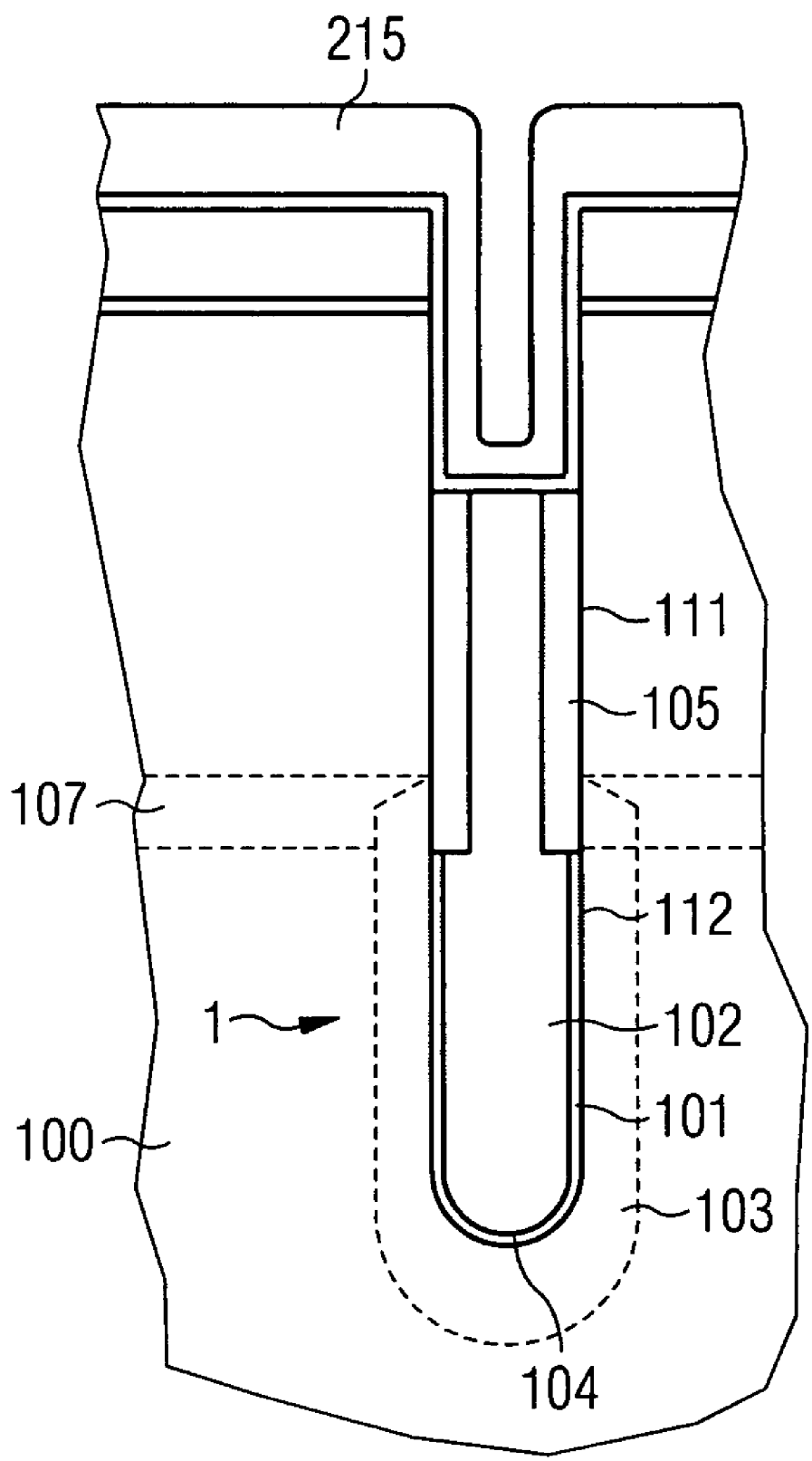

In a next process step, a polysilicon layer 215 is deposited. The polysilicon layer 215 is preferably $n^+$-doped with the same dopant as the trench filling 102. FIG. 3C shows a cross section through the silicon wafer 100 after this process step.

Figure 3D:
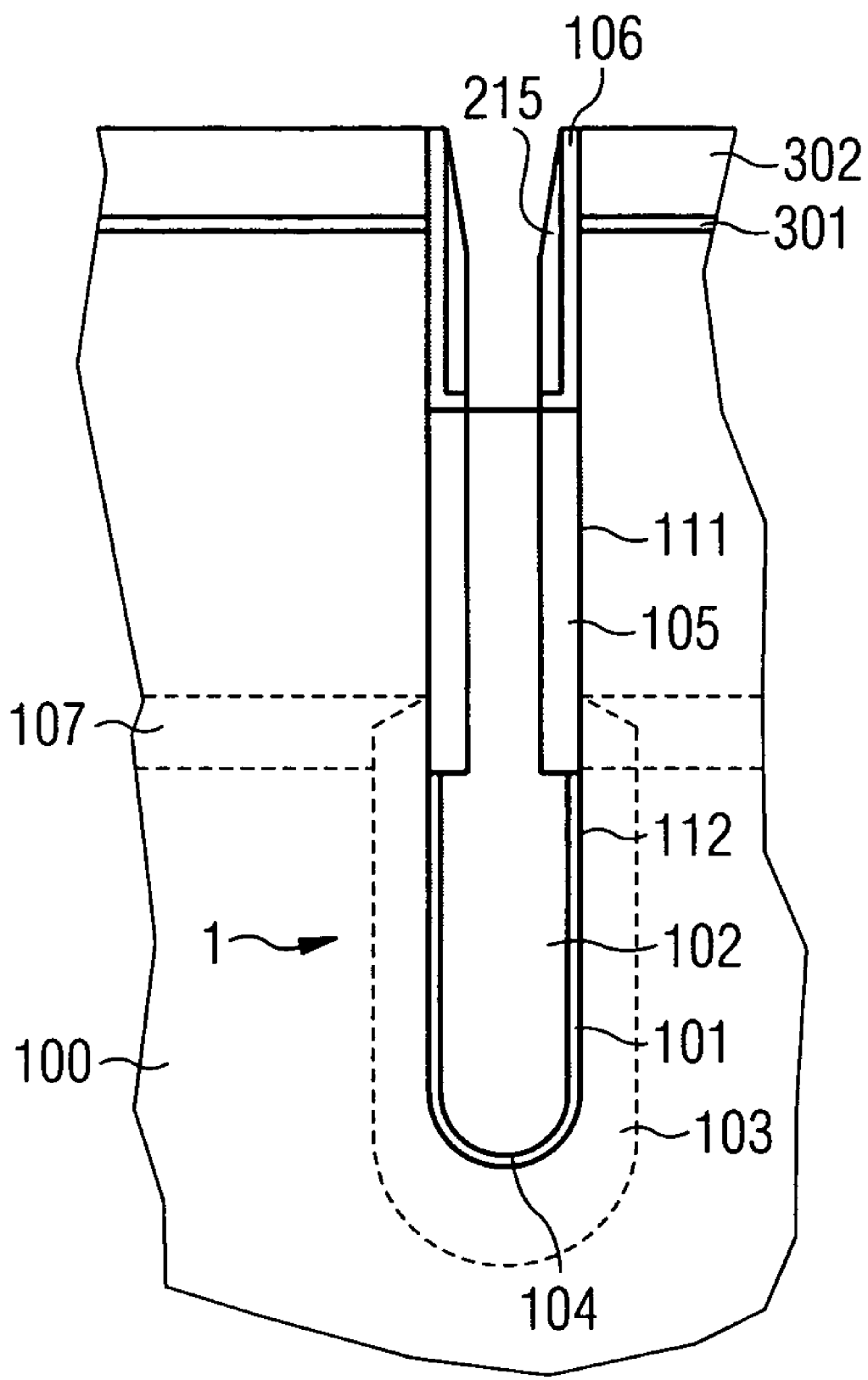
Figure 3E:
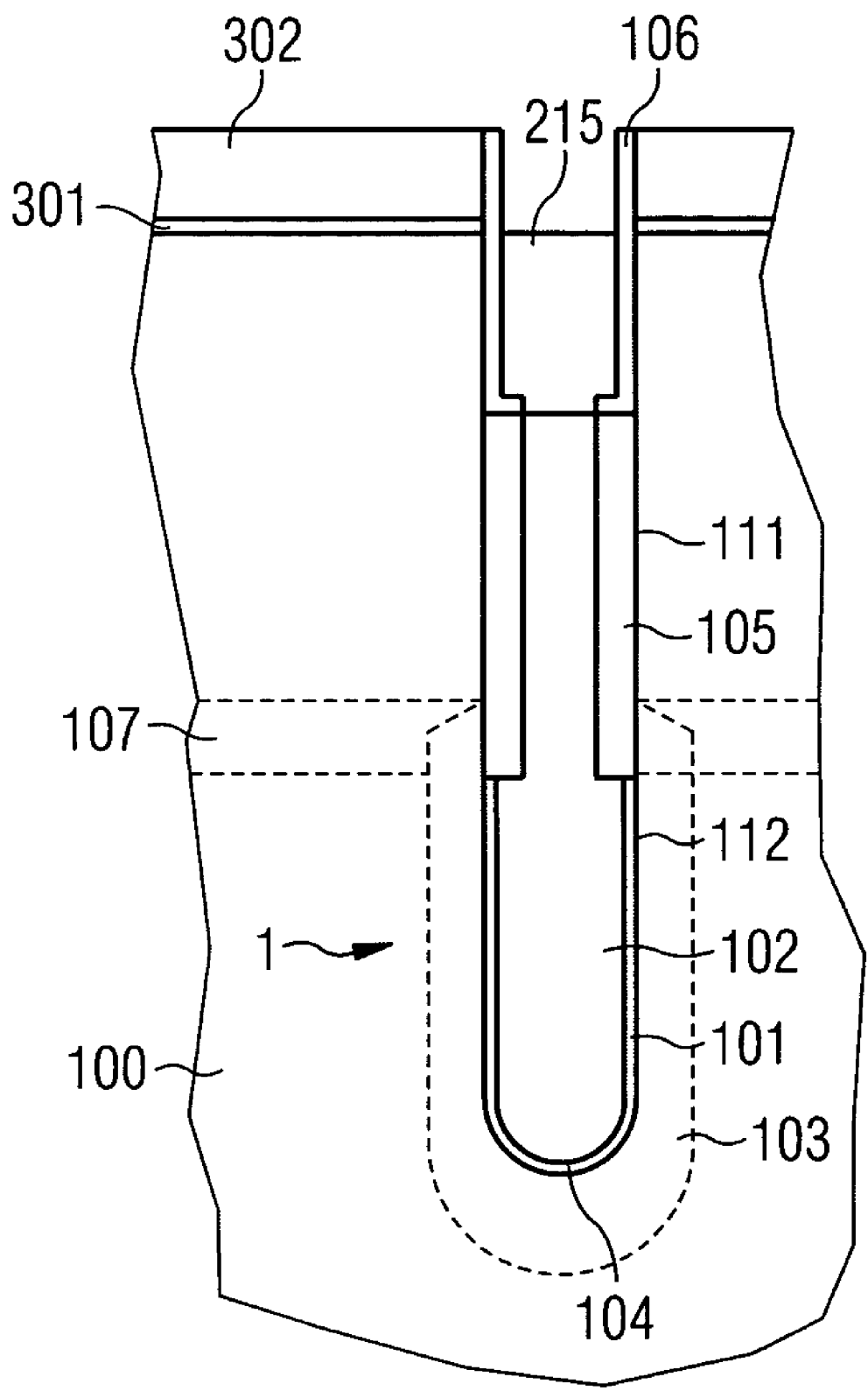

The thickness of the deposited polysilicon layer 215 is preferably approximately 20 nm. The polysilicon layer 215 is then etched back anisotropically in a further process step, so that the polysilicon is removed from the horizontal areas, in particular also from the bottom in the trench section 213, and the polysilicon spacer 215 remains on the trench wall. In a further process step, the uncovered $Si_3N_4$ layer 106 is then etched away at the horizontal areas, in particular also from the bottom of the trench section 113 above the polysilicon filling 102. A cross section through the silicon wafer 100 after this process step is illustrated in FIG. 3D.

In a concluding process step sequence for completing the buried strap contact 205, an $n^+$-type polysilicon deposition is then again effected in order to completely fill the trench again, and the polysilicon is subsequently etched back as far as the level of the silicon surface. A cross section through the silicon wafer after this process step for forming the buried strap contact according to the invention is shown in FIG. 1E. With the aid of the further known standard process sequence, the selection transistor is then fabricated in order to form a DRAM memory cell as is illustrated in FIG. 2.

The procedure according to the invention of leaving the $Si_3N_4$ liner layer 106 in the region of the interface with the silicon substrate 100, but removing it on the n$^+$-type polysilicon filling 102 of the trench 101, ensures that the silicon substrate 100 is not damaged during the formation of the buried strap contact, and at the same time ensures that the contact resistance between the buried strap contact 205 and the storage electrode 102 remains low.

What is claimed is:

1. A method for fabricating a buried strap contact for a storage capacitor of a memory cell, the storage capacitor being formed in a trench of a semiconductor substrate with an outer electrode layer around a lower region of the trench in the semiconductor substrate, a dielectric intermediate layer embodied on the lower region of the trench wall of the trench, an insulation layer, which is formed in a manner adjoining the dielectric intermediate layer on an upper region of the trench wall of the trench, and an inner electrode layer essentially filling the trench, comprising:
   etching back of the inner electrode layer into the trench, thereby uncovering the insulation layer;
   removing the uncovered insulation layer from the trench wall to define buried strap contact areas;
   depositing a liner layer to cover the inner electrode layer in the trench and the uncovered trench wall, the liner layer being thin enough to enable tunneling of charge carriers;
   forming a spacer layer with the material of the inner electrode layer on the liner layer at the trench wall, thereby forming an uncovered liner layer;
   removing the uncovered liner layer from the inner electrode layer in the trench; and
   filling the trench with the material of the inner electrode layer.

2. The method as claimed in claim 1, wherein the semiconductor substrate is an Si substrate, the material of the inner electrode layer being poly-Si, and the liner layer comprising $Si_3N_4$.

3. The method as claimed in claim 1, wherein a thickness of the liner layer is approximately 1 nm.

4. The method as claimed in claim 1, wherein the spacer layer is formed by depositing, in large-area fashion, a layer with the material of the inner electrode layer, which is essentially removed again from horizontal areas by anisotropic etching to uncover the liner layer at the trench bottom.

5. The method as claimed in claim 4, wherein the liner layer is concomitantly removed at the trench bottom during the anisotropic etching to form the spacer layer.

6. A method for fabricating a buried strap contact for a storage capacitor of a memory cell, the storage capacitor being formed in a trench of a semiconductor substrate with an outer electrode layer around a lower region of the trench in the semiconductor substrate, a dielectric intermediate layer embodied on the lower region of the trench wall of the trench, an insulation layer, which is formed in a manner adjoining the dielectric intermediate layer on an upper region of the trench wall of the trench, and an inner electrode layer essentially filling the trench, comprising:
   etching back of the inner electrode layer into the trench, thereby uncovering the insulation layer;
   removing the uncovered insulation layer from the trench wall to define buried strap contact areas;
   depositing a liner layer to cover the inner electrode layer in the trench and the uncovered trench wall;
   forming a spacer layer with the material of the inner electrode layer on the liner layer at the trench wall, thereby forming an uncovered liner layer;
   removing the uncovered liner layer from the inner electrode layer in the trench; and
   filling the trench with the material of the inner electrode layer, wherein the semiconductor substrate is an Si substrate, the material of the inner electrode layer being poly-Si, and the liner layer comprising $Si_3N_4$.

7. The method as claimed in claim 6, wherein a thickness of the liner layer between the buried strap contact on the inner electrode layer of the storage capacitor and the electrode region of the selection transistor being approximately 1 nm.

8. A method for fabricating a buried strap contact for a storage capacitor of a memory cell, the storage capacitor being formed in a trench of a semiconductor substrate with an outer electrode layer around a lower region of the trench in the semiconductor substrate, a dielectric intermediate layer embodied on the lower region of the trench wall of the trench, an insulation layer, which is formed in a manner adjoining the dielectric intermediate layer on an upper region of the trench wall of the trench, and an inner electrode layer essentially filling the trench, comprising:
   etching back of the inner electrode layer into the trench, thereby uncovering the insulation layer;
   removing the uncovered insulation layer from the trench wall to define buried strap contact areas;
   depositing a liner layer to cover the inner electrode layer in the trench and the uncovered trench wall;
   forming a spacer layer with the material of the inner electrode layer on the liner layer at the trench wall, thereby forming an uncovered liner layer;
   removing the uncovered liner layer from the inner electrode layer in the trench; and
   filling the trench with the material of the inner electrode layer, wherein
   the spacer layer is formed by depositing, in large-area fashion, a layer with the material of the inner electrode layer, which is essentially removed again from horizontal areas by anisotropic etching to uncover the liner layer at the trench bottom, and
   the liner layer is concomitantly removed at the trench bottom during the anisotropic etching to form the spacer layer.

* * * * *